United States Patent
Gaide (10) Patent No.: US 9,143,122 B1
(45) Date of Patent: Sep. 22, 2015

(54) ADAPTIVE LOW SKEW CLOCKING ARCHITECTURE

(71) Applicant: Xilinx, Inc., San Jose, CA (US)

(72) Inventor: Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/268,671

(22) Filed: May 2, 2014

(51) Int. Cl.
*H03K 5/159* (2006.01)
*H03K 5/00* (2006.01)

(52) U.S. Cl.
CPC ...... *H03K 5/159* (2013.01); *H03K 2005/00078* (2013.01)

(58) Field of Classification Search
CPC ....... G11C 7/222; H03K 5/133; H03K 5/135; H03K 5/13; H03K 5/131; H03K 5/132; H03K 5/15013; H03K 2005/00032; H03K 2005/00104; H03K 2005/00208; H03K 2005/00247; H03K 2005/00286; H03K 2005/00097; H03K 2005/00241
USPC ................. 327/141, 161, 163, 291, 295, 297; 716/125
See application file for complete search history.

(56) References Cited

U.S. PATENT DOCUMENTS

| 6,323,714 B1 | 11/2001 | Naffziger et al. |
| 7,216,319 B1 * | 5/2007 | Yau et al. ............ 326/40 |
| 8,205,182 B1 * | 6/2012 | Zlatanovici et al. .......... 716/125 |

OTHER PUBLICATIONS

Dike, Charles E. et al., "A Design for Digital, Dynamic Clock Deskew," *2003 Symposium on VLSI Circuits Digest of Technical Papers*, Jun. 14, 2003, pp. 21-24, IEEE, Piscataway, New Jersey, USA.

* cited by examiner

*Primary Examiner* — John Poos
*Assistant Examiner* — David Mattison
(74) *Attorney, Agent, or Firm* — Gerald Chan; LeRoy D. Maunu; Jonathan B. Soike (57) ABSTRACT

A system includes: an initial clock region; a first adjacent clock region adjacent to the initial clock region; a spine coupled to receive a clock signal from a clock; and a first phase detector coupled to detect a difference in phase between the initial clock region and the first adjacent clock region. The initial clock region comprises an initial delay element coupled to the spine and to the first phase detector.

11 Claims, 12 Drawing Sheets

ADAPTIVE LOW SKEW CLOCKING ARCHITECTURE

TECHNICAL FIELD

The present disclosure relates to clocking architecture. In particular, it relates to an adaptive low skew clocking architecture.

BACKGROUND

One of the metrics employed in designing a clocking architecture is skew (i.e., phase mismatch), both on the local level and on the global level. A clocking architecture may use a spine based topology, which may suffer from delay deltas due to clock paths with nominally different delays. For example, when clock root-to-load paths go through a varying number of clock spines, different delays among different clock regions in the clocking architecture may result. A clocking architecture may also suffer from process, voltage, and temperature (PVT) mismatch, even along otherwise identical paths. As a result, hold time violations are common across clock region boundaries in a clocking architecture and between dies, due to local skew problems. In addition, the performance of a clocking architecture may degrade, especially in higher speed designs, due to large global skews.

Also, a mesh deskew clock architecture has been proposed that relies on H-tree distribution to deliver a clock signal to clock regions in the clock architecture nearly simultaneously, and then use metal grid structures to deliver clock signals within a clock region. The problem with this technique is that H-trees are expensive to implement, both in terms of upper metal track usage and rebuffer transistor costs. In addition, an H-tree may increase injection delay, which correlates to increased jitter. In some cases, a particular circuit design may have multiple clock trees. Thus, any clocking costs attributable to H-tree are multiplied by the number of clock trees being implemented, which may be significant.

SUMMARY

A system includes: an initial clock region; a first adjacent clock region adjacent to the initial clock region; a spine coupled to receive a clock signal from a clock; and a first phase detector coupled to detect a difference in phase between the initial clock region and the first adjacent clock region. The initial clock region comprises an initial delay element coupled to the spine and to the first phase detector.

A method includes: injecting a clock signal onto a spine; detecting, using a first phase detector, a difference in phase between an initial clock region and a first adjacent clock region, the initial clock region having an initial delay element that is coupled to the spine; determining an amount of phase delay to be applied based at least in part on the difference in phase; and applying, using the initial delay element, the amount of phase delay for the initial clock region.

The features, functions, and advantages may be achieved independently in various embodiments, or may be combined in yet other embodiments.

BRIEF DESCRIPTION OF THE DRAWINGS

These and other features, aspects, and advantages of the present disclosure will become better understood with regard to the following description, appended claims, and accompanying drawings.

DETAILED DESCRIPTION

Various examples are described hereinafter with reference to the figures. It should be noted that the figures are only intended to facilitate the description of the exemplary structures and methods. They are not intended as an exhaustive description of the claimed invention, or as a limitation on the scope of the claimed invention. In addition, an illustrated example needs not have all the aspects or advantages shown. An aspect or an advantage described in conjunction with a particular example is not necessarily limited to that example, and can be practiced in any other examples even if not so illustrated, or if not so explicitly described.

A system with an adaptive low skew clocking architecture and associated methods are described herein. In some embodiments, the clocking architecture may reduce the costs of a traditional mesh deskew approach, while providing a clock skew reduction benefit. In some embodiments, the disclosed clocking architecture utilizes a spine system (e.g., horizontal and/or vertical spines), instead of H-trees, to propagate clock signal to each clock region of the clocking architecture. The spine system is less expensive than H-trees, because it provides direct point-to-point connections between clock regions and as such, it does not require extra metal tracks (as do H-trees). In some cases, H-trees are designed to equalize the delay to all destinations and, as such, some paths have additional wire added to equalize the delay, thereby causing the H-trees to have extra metal tracks.

Also, in some embodiments, the disclosed clocking architecture uses delay elements to null out any skew between the clock regions, thereby obviating the need to use H-tree. Furthermore, because the injection delay of a spine system is lower than an H-tree approach, it follows that the jitter may also be lower for the spine system as well.

Figure 1:
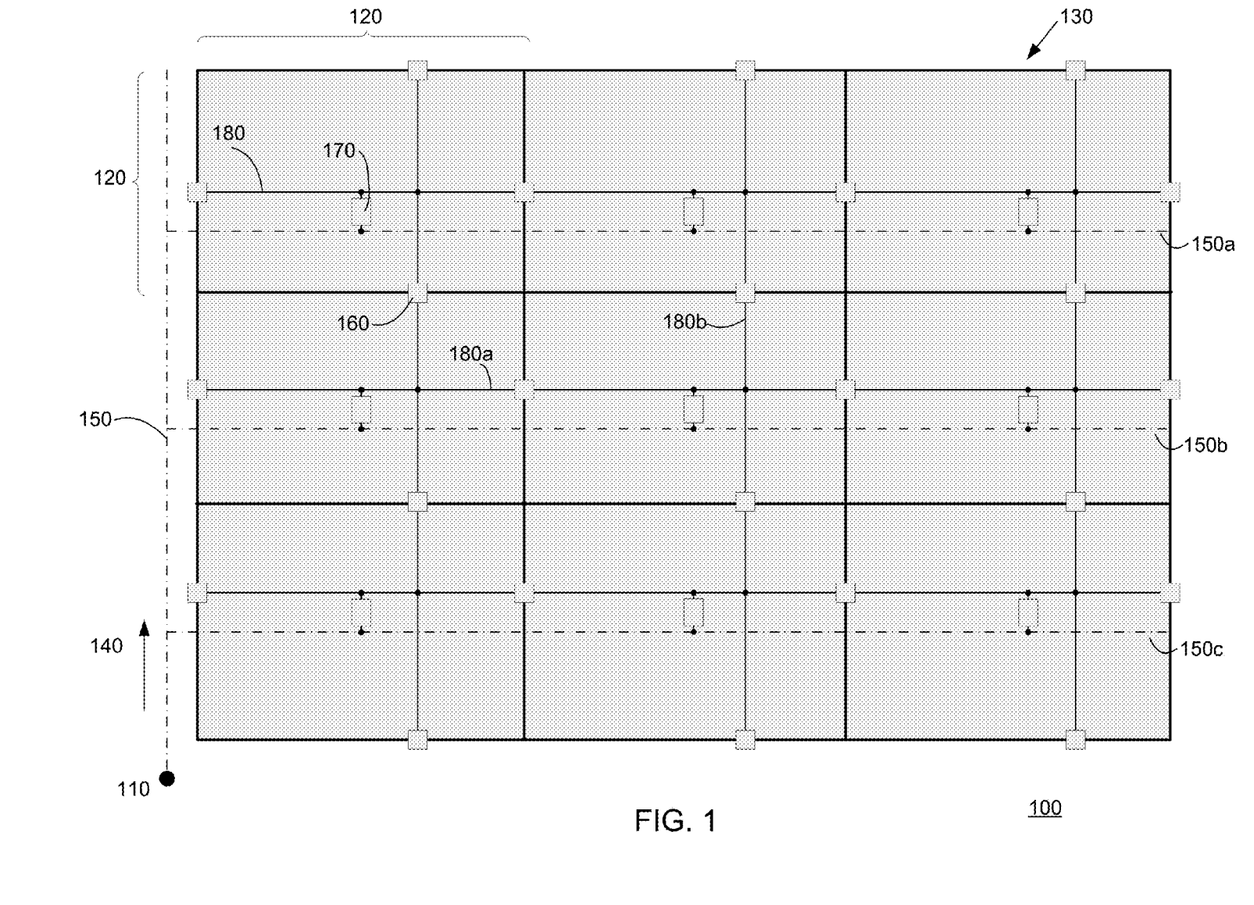
FIG. 1 is a schematic diagram depicting an adaptive low skew clocking architecture.

FIG. 1 is a schematic diagram 100 depicting an adaptive low skew clocking architecture (a clocking system). In this figure, nine clock regions 120 are shown to be on a die (e.g., a die of an integrated circuit, such as a field programmable gate array (FPGA)) 130. Also in this figure, a clock or clock source 110 is injecting a clock signal 140 onto a spine network 150. The clock 110 may be a configuration clock or a local clock. The spine network 150 comprises three horizontal spines 150a, 150b, 150c that run through the nine clock regions 120 horizontally.

Although nine clock regions 120 are shown, in other embodiments, there may be more than nine clock regions 120, or fewer than nine clock regions 120. Also, in other embodiments, there may be more than three spines or fewer than three spines in the spine network 150. In addition, in other embodiments, the spines in the spine network 150 may have other orientations. In particular, in some embodiments, the spine network 150 may comprise only horizontal spines 150a, 150b, 150c that run through the clock regions 120, as is shown in FIG. 1, may comprise only vertical spines that run through the clock regions 120, or may comprise both vertical spines and horizontal spines that run through the clock regions 120. Furthermore, in other embodiments, there may be more than one clock 110, and each clock 110 may be injecting more than one clock signal 140 onto the spine network 150. For example, there may be multiple clocks 110 injecting respective clock signals 140 onto the spine network 150. In addition, in other embodiments, there may be more than one spine network 150.

Referring back to FIG. 1, each clock region 120 comprises four phase detectors 160. Each of the four phase detectors 160, of each clock region 120, lie on a side (e.g., edge) of the clock region 120. Each clock region 120 also comprises a delay element 170. Each delay element 170 is connected to the spine network 150 via a horizontal spine of the spine network 150. In addition, for each clock region 120, the delay element 170 is connected to the four phase detectors 160 via a phase distribution spine network 180. The phase distribution spine network 180 comprises three horizontal phase distribution spines 180a and three vertical phase distribution spines 180b that run through the clock regions 120.

It should be noted that in other embodiments, each clock region 120 may comprise more or fewer than four phase detectors 160. Also, it should be noted that in other embodiments, each clock region 120 may comprise more than one delay element 170. In one or more embodiments, each delay element 170 may comprise a variable delay element and, optionally, a static delay element (e.g., a memcell programmable delay element). For example, in some embodiments, each delay element 170 may include a variable fine delay element and a static delay element. In other embodiments, each delay element 170 may include a variable fine delay element and a variable coarse delay element. In further embodiments, each delay element 170 may include other sub-delay component, or combination of sub-delay components.

In addition, in other embodiments, there may be more than one phase distribution spine network 180. Also, in other embodiments, each phase distribution spine network 180 may comprise only horizontal phase distribution spines 180a that run through the clock regions 120, may comprise only vertical phase distribution spines 180b that run through the clock regions; or may comprise both vertical phase distribution spines 180b and horizontal phase distribution spines 180a that run through the clock regions.

As shown in FIG. 1, a clock region 120 of the clocking architecture may have two adjacent clock regions, three adjacent clock regions, or four adjacent clock regions.

For example, the clock region 120 at the upper left corner has two adjacent clock regions (e.g., a first adjacent clock region with a first phase detector 160 between the clock region 120 and the first adjacent clock region to detect their phase difference, and a second adjacent clock region with a second phase detector 160 between the clock region 120 and the second adjacent clock region to detect their phase difference). The two phase detectors 160 are connected to the delay element 170 of the clock region 120 at the upper left corner. For this clock region 120 (at the upper left corner), the amount of phase delay to be applied is determined based at least in part on the difference in phase between the clock region 120 and the first adjacent clock region, and the difference in phase between the clock region 120 and the second adjacent clock region.

The clock region at the upper middle has three adjacent clock regions (e.g., a first adjacent clock region with a first phase detector 160 between the clock region 120 and the first adjacent clock region to detect their phase difference, a second adjacent clock region with a second phase detector 160 between the clock region 120 and the second adjacent clock region to detect their phase difference, and a third adjacent clock region with a third phase detector 160 between the clock region 120 and the third adjacent clock region to detect their phase difference). The three phase detectors 160 are connected to the delay element 170 of the clock region 120 at the upper middle. For this clock region 120 (at the upper middle), the amount of phase delay to be applied is determined based at least in part on the difference in phase between the clock region 120 and the first adjacent clock region, the difference in phase between the clock region 120 and the second adjacent clock region, and the difference in phase between the clock region 120 and the third adjacent clock region.

The clock region in the middle has four adjacent clock regions (e.g., a first adjacent clock region with a first phase detector 160 between the clock region 120 and the first adjacent clock region to detect their phase difference, a second adjacent clock region with a second phase detector 160 between the clock region 120 and the second adjacent clock region to detect their phase difference, a third adjacent clock region with a third phase detector 160 between the clock region 120 and the third adjacent clock region to detect their phase difference, and a fourth adjacent clock region with a fourth phase detector 160 between the clock region 120 and the fourth adjacent clock region to detect their phase difference). The four phase detectors 160 are connected to the delay element 170 of the clock region 120 in the middle. Although not shown, in other embodiments, an initial clock region 120 may include only one adjacent clock region adjacent to the initial clock region. For this clock region 120 (at the middle of the figure), the amount of phase delay to be applied is determined based at least in part on the difference in phase between the clock region 120 and the first adjacent clock region, the difference in phase between the clock region 120 and the second adjacent clock region, the difference in phase between the clock region 120 and the third adjacent clock region, and the difference in phase between the clock region 120 and the fourth adjacent clock region.

There are two modes of operation for the adaptive low skew clocking architecture of FIG. 1. In the first mode of operation, a configuration clock (e.g., a low frequency clock such that the difference in phase detected is less than 180 degrees, e.g., a 50 megahertz (MHz) clock) is used for the clock 110 for an initial deskew of the clock regions 120 resulting from manufacturing differences. The configuration clock (i.e., a low frequency clock) is used to prevent the clock regions 120 from locking onto different edges (e.g., sinusoidal edges) of the clock signal 140, in the event that half of the clock period of the clock signal 140 is less than the potential initial delay mismatch between the clock regions 120.

During operation, the clock 110 (e.g., the configuration clock in the illustrated example) injects a clock signal 140 onto the spine network 150. Then, the phase detectors 160 of each clock region 120 detect (e.g., measure) the difference in phase between the clock region 120 and the adjacent clock regions. Note that most of the phase detectors 160 lie on an edge of two clock regions 120, and measure the phase difference between the two clock regions 120. For example, if a certain clock region 120 has four phase detectors 160 on the respective four sides of the clock region 120 that are next to respective four respective adjacent clock regions 120, then the four phase detectors 160 detect the difference in phase between the clock region 120 and its four respective adjacent clock regions 120. The phase detector 160 of each clock region 120 sends the detected difference in phase to the delay element 170 of the corresponding clock region 120. Then, a component (e.g., the static/coarse/fine delay element) of the delay element 170 for each clock region 120 determines an amount of phase delay to be applied according to the detected difference in phase, such that all of the clock regions 120 have the same phase (i.e., have a shared common phase). The component (e.g., static/coarse/fine delay element) of the delay element 170 for each clock region 120 then applies that determined amount of phase onto the phase distribution spine network 180. The process iteratively repeats until all of the clock regions 120 are similarly deskewed (e.g., all of the clock regions 120 have a common phase) to within a specified phase detection acceptance window (i.e., to within a specified tolerance, such as 10 picoseconds). After all of the clock regions 120 are similarly deskewed, the configuration clock is removed, and a local clock is used for the clock 110, and then normal operation of the die 130 begins.

In the first mode, after the clock regions 120 are deskewed, the phase detectors 160 no longer monitor the phase delays among the clock regions 120 during the normal operation of the die 130.

In the second mode of operation, after the clock regions 120 are deskewed, the phase detectors 160 continue to monitor the phase delays among the clock regions 120 during the normal operation of the die 130. In particular, the second mode of operation starts off the same as the first mode, but the phase detectors 160 perform a continuous monitoring of the phase delays among the clock regions 120 during normal operation of the die 130. In the second mode of operation a configuration clock (e.g., a low frequency clock such that the difference in phase detected is less than 180 degrees, e.g., a 50 megahertz (MHz) clock) is used for the clock 110 for an initial deskew of the clock regions 120 resulting from manufacturing differences. During operation, the clock 110 (e.g., the configuration clock in the illustrated example) injects a clock signal 140 onto the spine network 150. Then, the phase detectors 160 of each clock region 120 detect the difference in phase between its clock region 120 and the adjacent clock regions. The phase detectors 160 of each clock region 120 send the detected differences in phase to the delay element 170 of the clock region 120. Then, the component (e.g., static/coarse/fine delay element) of the delay element 170 for each clock region 120 determines an amount of phase delay to be applied according to the detected difference in phase, such that all of the clock regions 120 have the same phase. The component (e.g., static/coarse/fine delay element) of the delay element 170 for each clock region 120 then applies that determined amount of phase onto the phase distribution spine network 180. The process iteratively repeats until all of the clock regions 120 are similarly deskewed (i.e., all of the clock regions 120 have a common phase) to within a specified phase detection acceptance window (i.e., to within a specified tolerance, such as 10 picoseconds). After all of the clock regions 120 are similarly deskewed, the configuration clock is removed, and a local clock is used for the clock 110, and then normal operation of the die 130 begins.

During normal operation of the die 130, there is a continuous monitoring of the phase differences between the clock regions 120 resulting from power, voltage, and temperature (PVT) mismatch. As such, during normal operation, the clock 110 (e.g., the local clock in the illustrated example) injects a clock signal 140 onto the spine network 150. Then, the phase detectors 160 of each clock region 120 detect the difference in phase between the clock region 120 and the adjacent clock regions. For example, if a certain clock region 120 has four phase detectors 160 on the respective four sides of the clock region 120 that are next to respective four respective adjacent clock regions 120, then the four phase detectors 160 detect the difference in phase between the clock region 120 and its four respective adjacent clock regions 120. The phase detector 160 of each clock region 120 simultaneously sends the detected difference in phase (i.e., all phase detectors 160 broadcast the detected phase difference simultaneously) to the delay element 170 of its clock region 120.

Then, the variable delay element of the delay element 170 for each clock region 120 determines an amount of phase delay to be applied according to the detected difference in phase, such that all of the clock regions 120 have the same phase (i.e., have a shared common phase). The variable delay element of the delay element 170 for each clock region 120 then applies that determined amount of phase onto the phase distribution spine network 180. The process iteratively repeats until all of the clock regions 120 are similarly deskewed to within a specified phase detection acceptance window (i.e., to within a specified tolerance, such as 10 picoseconds). After all of the clock regions 120 are similarly deskewed, the phase detectors 160 continuously monitor the phase differences between the clock regions 120. If the phase detectors 160 determine that any of the clock regions 120 exhibits a phase difference greater than the specified phase detection acceptance window, the process will iteratively repeat until all of the clock regions 120 are similarly deskewed to within the specified phase detection acceptance window.

FIGS. 2-9 are schematic diagrams 200, 300, 400, 500, 600, 700, 800, 900 depicting the process of the deskewing of the clock regions 120 (e.g., as in the first mode of operation).

Figure 2:
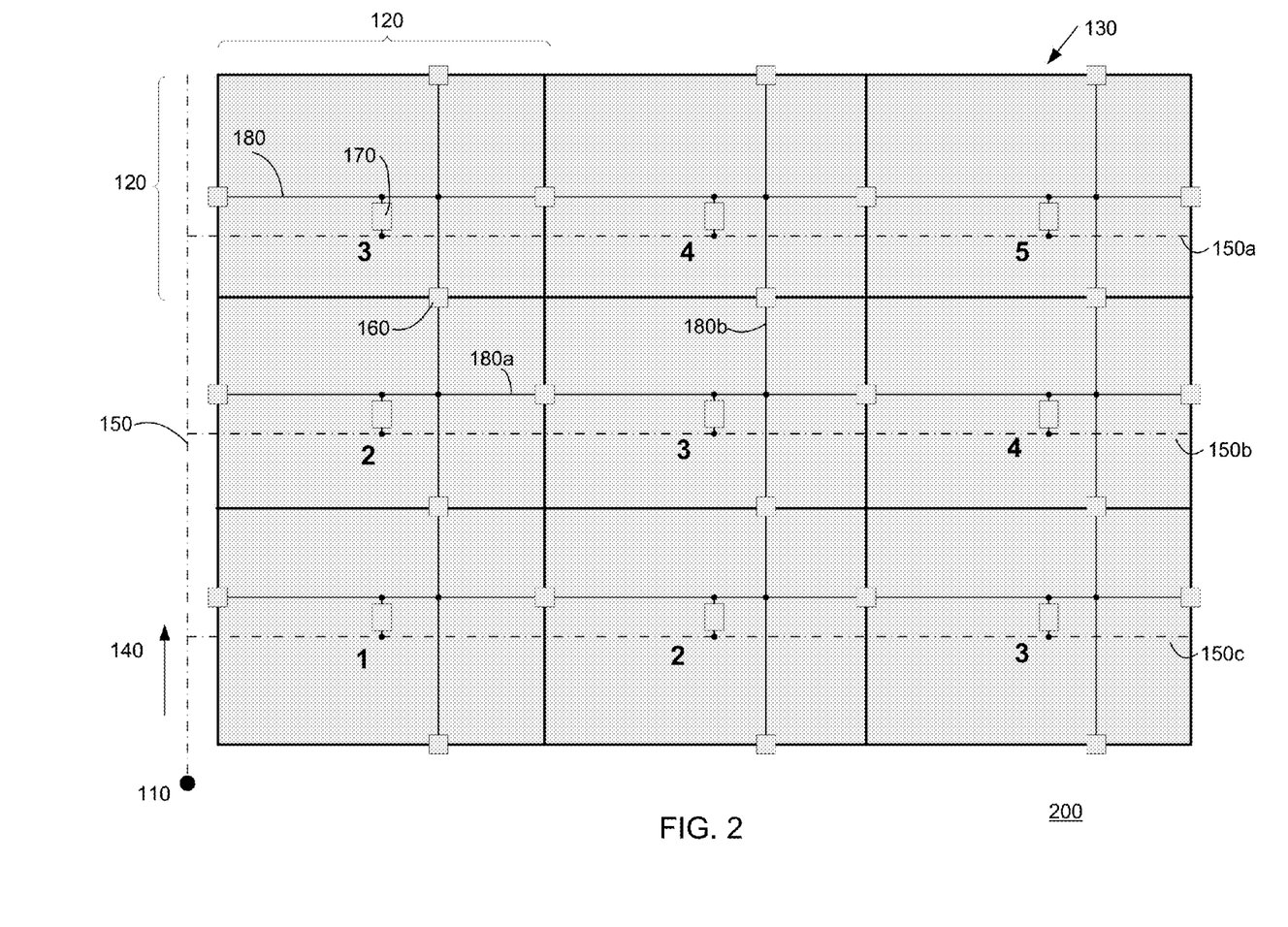
FIG. 2 is a schematic diagram showing the adaptive low skew clocking architecture of FIG. 1, particularly showing phase delays for different clock regions.

FIG. 2 is a schematic diagram 200 showing the disclosed adaptive low skew clocking architecture of FIG. 1 displaying exemplary phase delays for each of the clock regions 120. In this figure, the numbers displayed in each clock region 120 represent the detected phase delay for that clock region 120. It should be noted that the delay detected in the vertical spine 180*b* and the delay detected in the horizontal spine 180*a* both contribute to the detected phase delay. As is shown in this figure, the longest delay detected by the phase detectors 160 for the clock regions 120 is "5" and the shortest delay detected by the phase detectors 160 is 1.

Figure 3:
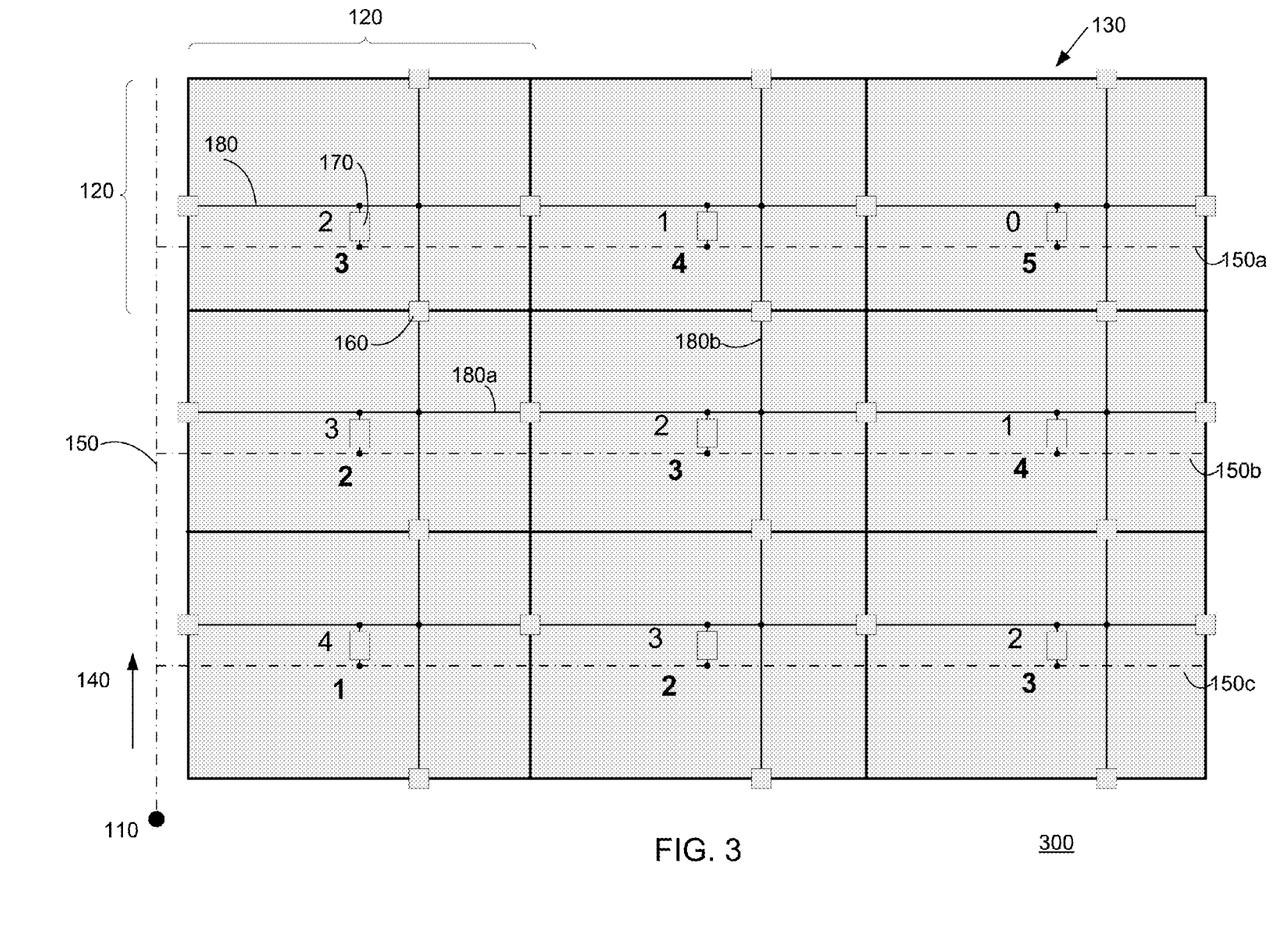
FIG. 3 is a schematic diagram illustrating the adaptive low skew clocking architecture of FIG. 1, particularly showing the phase delays for the clock regions and phase delays to be applied for the different clock regions.

FIG. 3 is a schematic diagram 300 illustrating the disclosed adaptive low skew clocking architecture of FIG. 1 showing the exemplary phase delays for each of the clock regions 120 and the phase delays to be applied for each clock region 120. In this figure, the numbers displayed next to the delay elements 170 represent the amount of phase delay to be applied so as to deskew all of the clock regions 120 such that they all have a target delay, which is the longest delay detected (e.g., to have a delay of 5). For example, for the clock region 120 at the upper left of the figure, the detected phase delay is 3. So in order to deskew that clock region 120 to achieve the longest detected delay of 5, a delay of 2 is to be applied so that the total combined delay of 3+2=5 is achieved.

Figure 4:
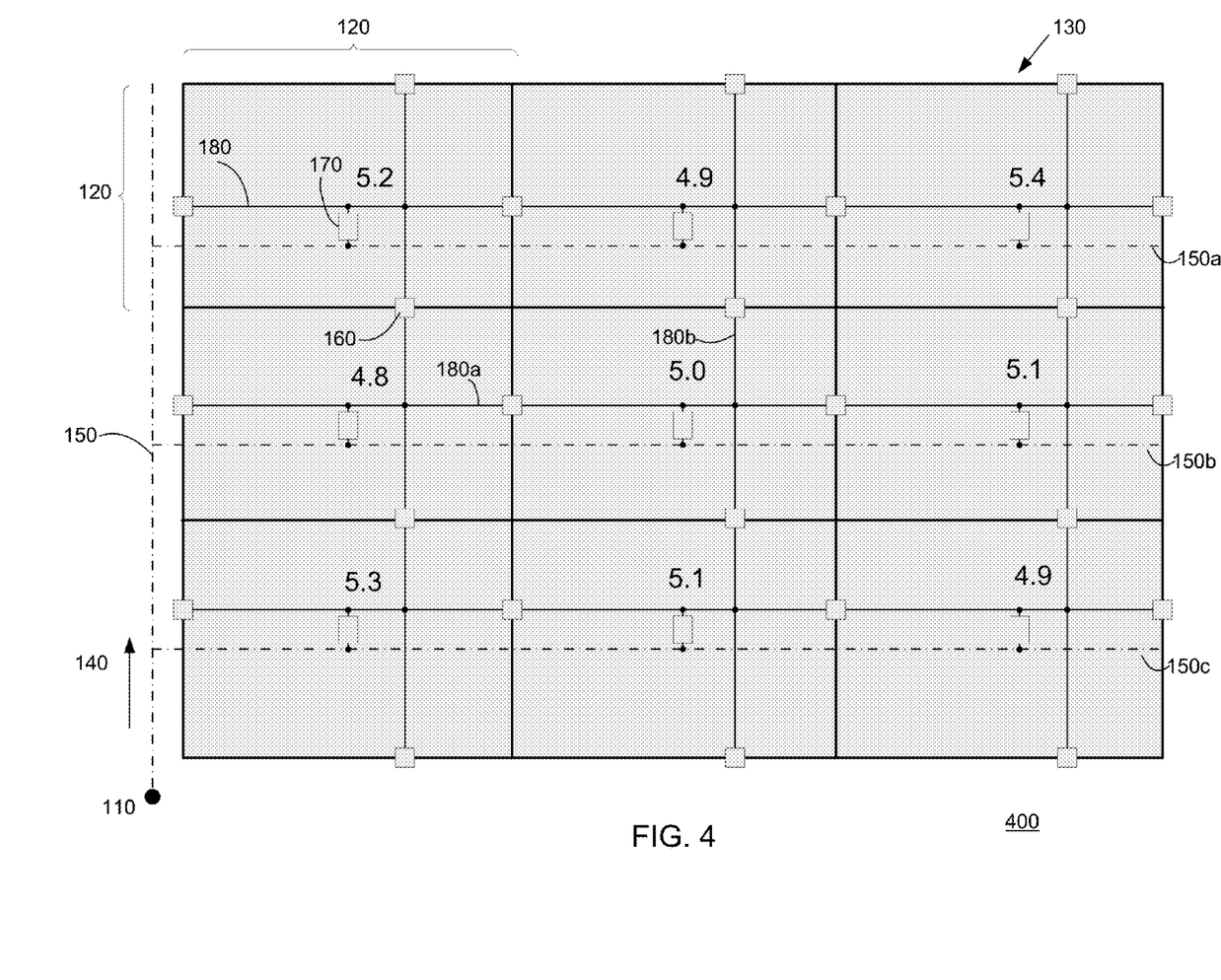
FIG. 4 is a schematic diagram depicting the adaptive low skew clocking architecture of FIG. 1, particularly showing phase delays for the different clock regions after the phase delays of FIG. 2 are applied for the different clock regions.

FIG. 4 is a schematic diagram 400 depicting the disclosed adaptive low skew clocking architecture of FIG. 1 showing the phase delays for each of the clock regions 120 after the phase delays of FIG. 2 are applied for the clock regions 120. In this figure, the numbers displayed in the clock regions 120 represent the detected phase delays for the respective clock regions 120, after the phase delays of FIG. 3 have been applied. As is shown in this figure, the longest delay detected for the clock regions 120 is 5.4 and the shortest delay detected is 4.8. It should be noted that the reason the detected delays are not all exactly 5.0 is because the circuit process variation may limit the precision of the delay elements 170.

Figure 5:
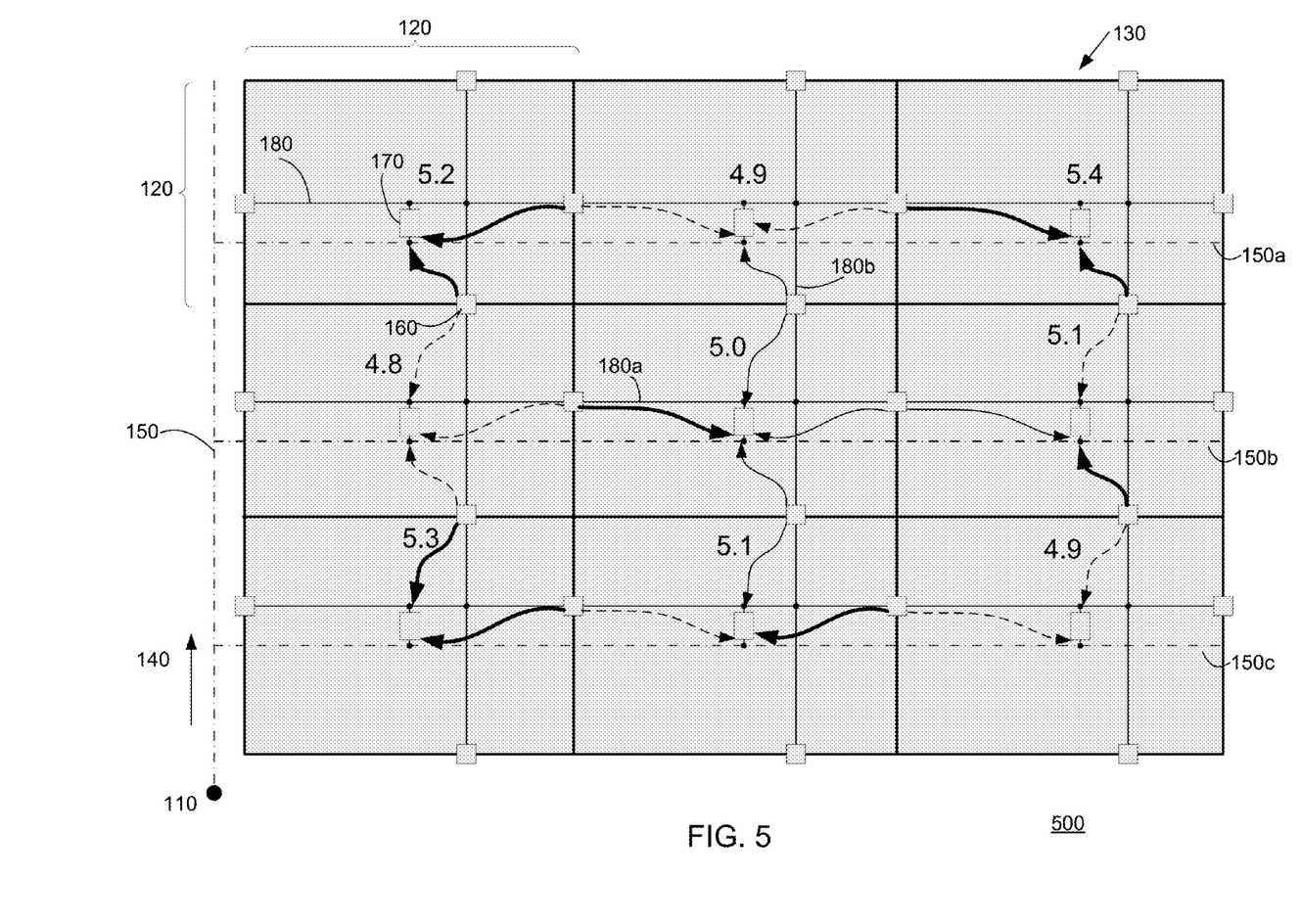
FIG. 5 is a schematic diagram illustrating the adaptive low skew clocking architecture of FIG. 1, particularly showing phase detectors' feedbacks for the different clock regions according to the phase delays of FIG. 4.

FIG. 5 is a schematic diagram 500 illustrating the disclosed adaptive low skew clocking architecture of FIG. 1, particularly showing feedbacks from the phase detectors 160 for the clock regions 120 according to the detected phase delays of FIG. 4. In this figure, the bold wavy lines represent feedbacks from the phase detectors 160 to the delay elements 170 so that the delay elements 170 will speed up the phase delay (i.e., a "speed up" signal). Also in this figure, the solid wavy lines represent feedbacks from the phase detectors 160 to the delay elements 170 so that the delay elements 170 will make no change to the phase delay (i.e., a "no change" signal). The dashed wavy lines represent feedbacks from the phase detectors 160 to the delay elements 170 so that the delay elements 170 will slow down the phase delay (i.e., a "slow down" signal). In the illustrated example, the delay element 170 sends a speed up signal for its clock region 120 if the adjacent clock region 120 has a smaller delay (e.g., with the absolute value of the difference being larger than a prescribed threshold, such as 0.1) than the clock region in which the delay element 170 is located. Also, the delay element 170 sends a slow down signal for its clock region 120 if the adjacent clock region 120 has a larger delay (e.g., with the absolute value of the difference being larger than a prescribed threshold, such as 0.1) than the clock region 120 in which the delay element 170 is located. In addition, if the difference in delay between two adjacent clock regions 120 is less than or equal to a prescribed threshold (e.g., 0.1), then the delay element 170 will make no change to the phase delay (e.g., output a "no change" signal).

It should be noted that one exemplary algorithm for the feedback signals to be employed by the delay elements 170 is as follows. If a delay element 170 for a particular clock region receives all "speed up" signals, the delay element 170 will speed up the phase delay. If a delay element 170 receives at least one "speed up" signal and at least one "no change" signal, but no "slow down" signals, the delay element 170 will speed up the phase delay. If a delay element 170 receives all "slow down" signals, the delay element 170 will slow down the phase delay. If a delay element 170 receives at least one "slow down" signal and at least one "no change" signal, but no "speed up" signals, the delay element 170 will slow down the phase delay. However, if a delay element 170 receives at least one "slow down" signal and at least one "speed up" signal, the delay element 170 will make no change to the phase delay. In addition, it should be noted that other algorithms for the feedback signals than the one described above may be employed by the delay elements 170.

Figure 6:
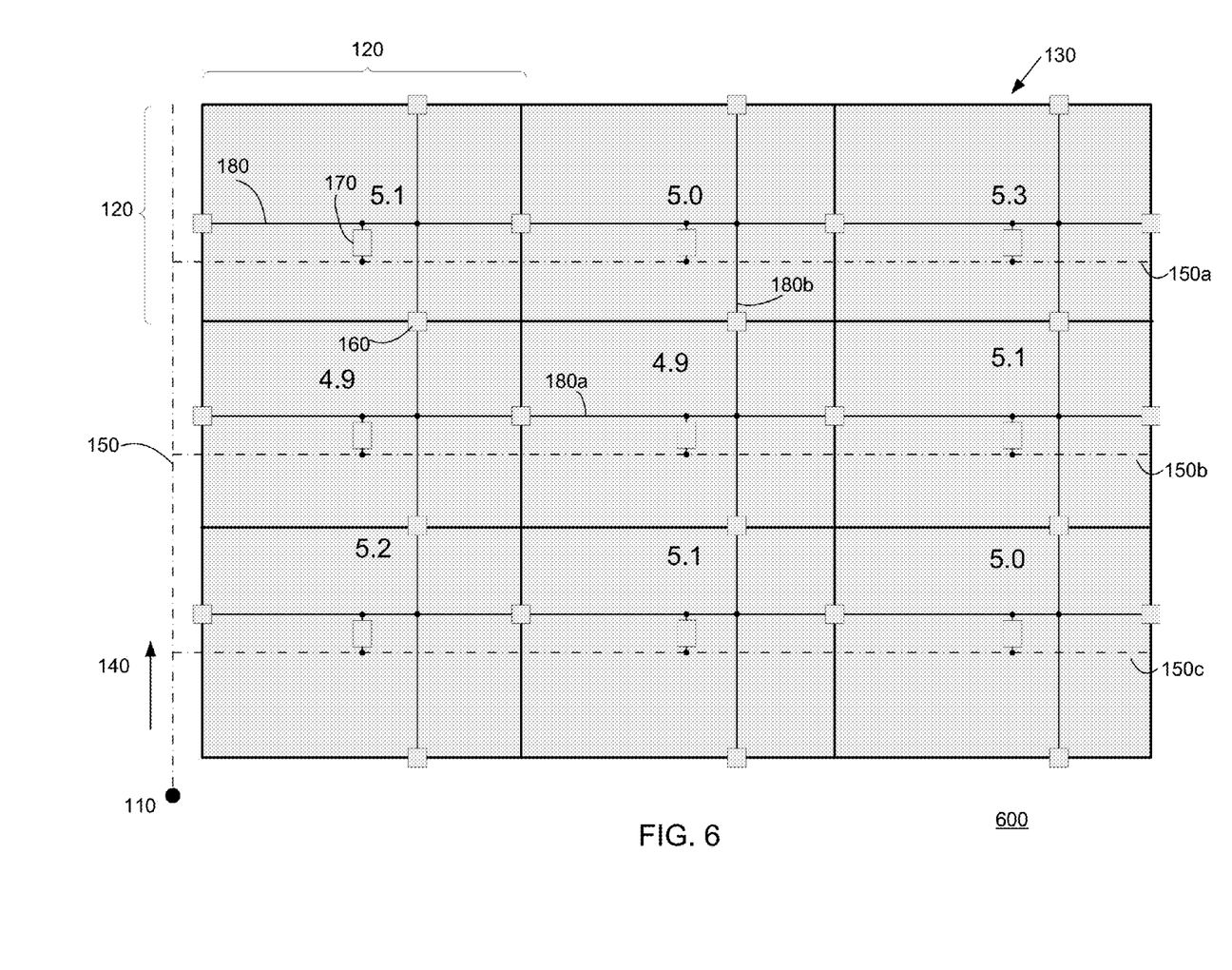
FIG. 6 is a schematic diagram depicting the adaptive low skew clocking architecture of FIG. 1, particularly showing a result after phase delay adjustments according to the feedbacks of FIG. 5 have been made.

FIG. 6 is a schematic diagram 600 depicting the disclosed adaptive low skew clocking architecture of FIG. 1, particularly showing a result (detected phases) after the phase delay adjustments according to the feedbacks of FIG. 5 from the phase detectors 160 have been made.

In particular, in this figure, the numbers displayed in the clock regions 120 represent the detected phase delays for the respective clock regions 120, after the phase delays, according to the feedbacks (of FIG. 5) from the phase detectors 160 have been applied.

Figure 7:
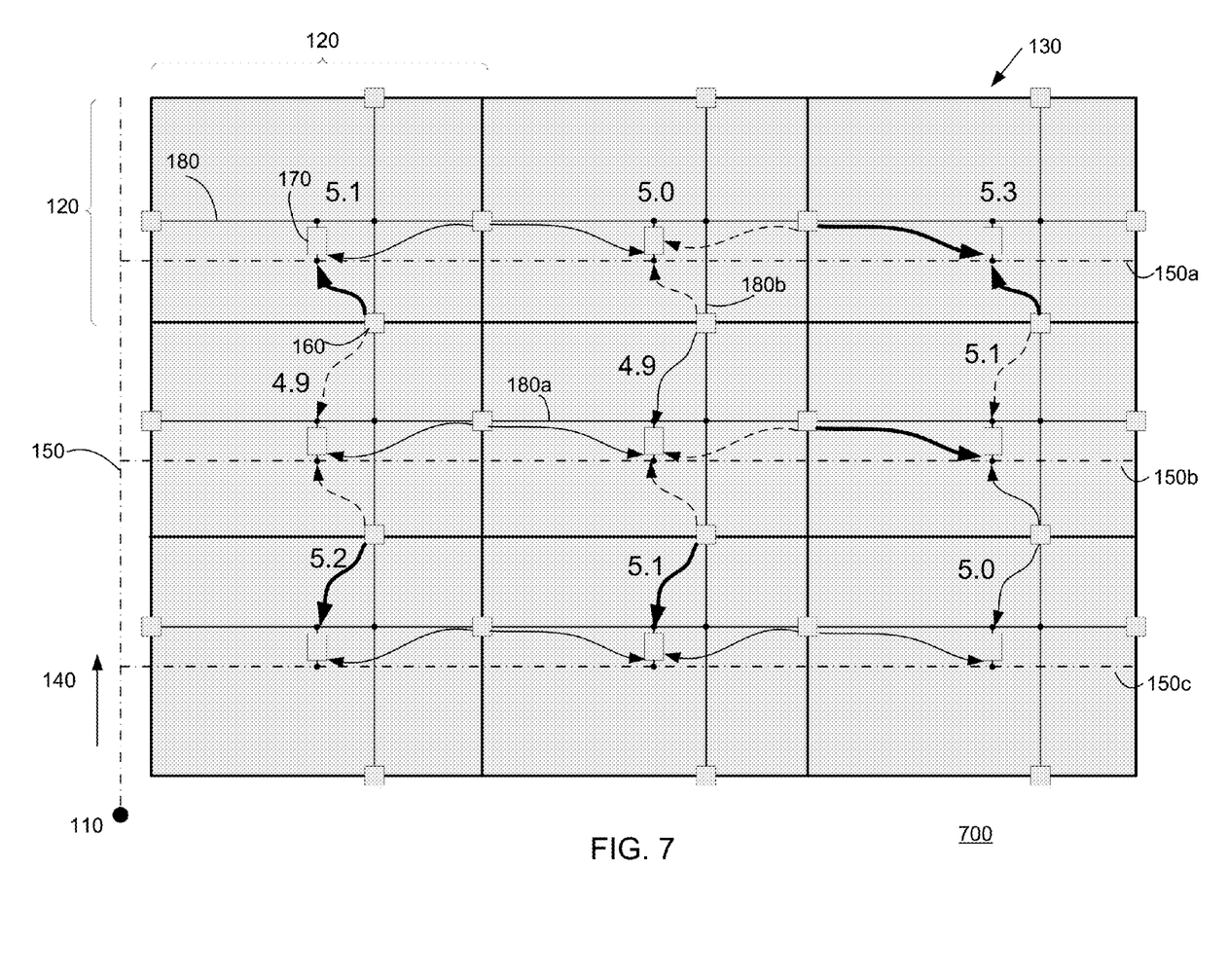
FIG. 7 is a schematic diagram illustrating the adaptive low skew clocking architecture of FIG. 1, particularly showing phase detectors' feedbacks for the different clock regions according to the phase delays of FIG. 6.

FIG. 7 is a schematic diagram 700 illustrating the disclosed adaptive low skew clocking architecture of FIG. 1, particularly showing feedbacks from the phase detectors 160 for the clock regions 120 according to the detected phase delays of FIG. 6. In this figure, the bold wavy lines represent feedbacks from the phase detectors 160 to the delay elements 170 so that the delay elements 170 will speed up the phase delay. Also in this figure, the solid wavy lines represent feedbacks from the phase detectors 160 to the delay elements 170 so that the delay elements 170 will make no change to the phase delay. The dashed wavy lines represent feedbacks from the phase detectors 160 to the delay elements 170 so that the delay elements 170 will slow down the phase delay. In the illustrated example, the delay element 170 sends a speed up signal for its clock region 120 if the adjacent clock region 120 has a smaller delay (e.g., with the absolute value of the difference being larger than a prescribed threshold, such as 0.1) than the clock region in which the delay element 170 is located. Also, the delay element 170 sends a slow down signal for its clock region 120 if the adjacent clock region 120 has a larger delay (e.g., with the absolute value of the difference being larger than a prescribed threshold, such as 0.1) than the clock region 120 in which the delay element 170 is located. In addition, if the difference in delay between two adjacent clock regions 120 is less than or equal to a prescribed threshold (e.g., 0.1), then the delay element 170 will make no change to the phase delay (e.g., output a "no change" signal).

Figure 8:
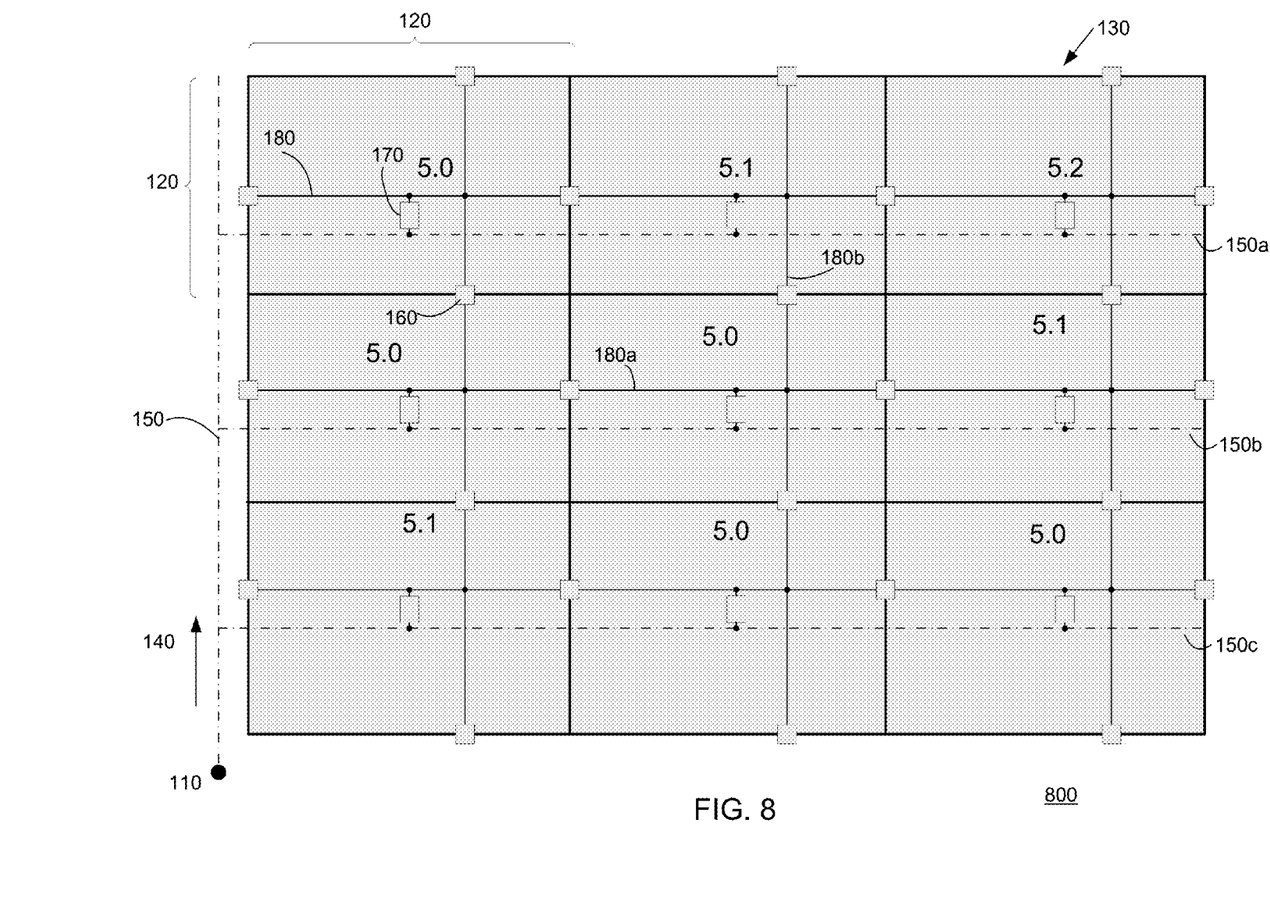
FIG. 8 is a schematic diagram depicting the adaptive low skew clocking architecture of FIG. 1, particularly showing a result after phase delay adjustments according to the feedbacks of FIG. 7 have been made.

FIG. 8 is a schematic diagram 800 depicting the disclosed adaptive low skew clocking architecture of FIG. 1, particularly showing a result (detected phases) after the phase delay adjustments according to the feedbacks of FIG. 7 from the phase detectors 160 have been made. In particular, in this figure, the numbers displayed in the clock regions 120 represent the detected phase delays for the respective clock regions 120, after the phase delays, according to the phase detector's 160 feedbacks of FIG. 7 have been applied.

Figure 9:
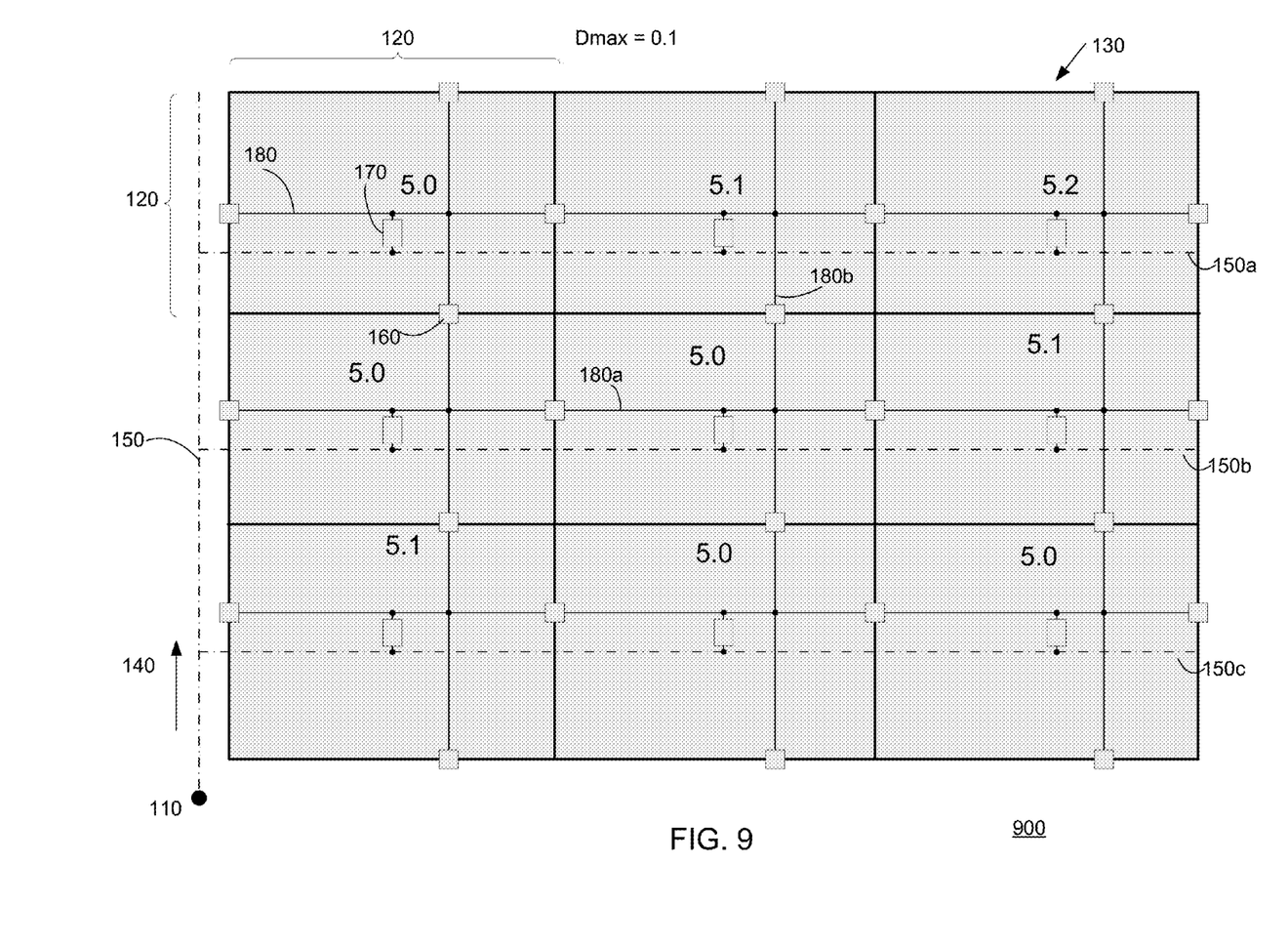
FIG. 9 is a schematic diagram depicting the adaptive low skew clocking architecture of FIG. 1, particularly showing the completed deskew where the phase delays for adjacent clock regions are within a specified tolerance.

FIG. 9 is a schematic diagram 900 depicting the disclosed adaptive low skew clocking architecture of FIG. 1, particularly showing the completed deskew where the phase delays for adjacent clock regions 120 are within a specified tolerance (e.g., 0.1). In this figure, the numbers displayed in the clock regions 120 represent the detected phase delays for the respective clock regions 120, and are the same as those shown in FIG. 8. As shown in this figure, the longest delay detected for the clock regions 120 is 5.2 and the shortest delay detected is 5.0. The largest difference in the detected delays for adjacent clock regions 120 (e.g., clock regions 120 that are directly adjacent to one another) is 0.1. In other embodiments, the specified tolerance may have other values, which, for example, may be less than 0.1 or more than 0.1.

In some embodiments, no assertion is made regarding the global tolerance (e.g., the phase difference between two of any of the clock regions 120), except that for the worst case, the difference may be required to be less than or equal to the maximum number of interfaces between any two clock regions multiplied by the specified tolerance (e.g., the tolerance specified for adjacent clock regions 120). For this example, the left most clock regions 120 and the right most clock regions 120 are the furthest apart in terms of interfaces (e.g., four interfaces two vertical spines 180*b* and two clock region 120 edges) must be crossed to travel from one side to the other). As such, the worst case skew would be equal to 0.4 (e.g., 4 interfaces times the specified tolerance, or 4*0.1=0.4).

The above clocking architecture has several advantages. First, the clocking architecture utilizes a mesh deskew in conjunction with a simple spine based clocking topology, along with optional additional delays, in order to reduce the clock network cost as well as the injection delay. In addition, the mesh deskew concept of the above clocking architecture may be extended to deskew multiple dies (e.g., deskew multiple integrated circuits, such as Field Programmable Gate Arrays (FPGAs) or other programmable, non-programmable, or partially programmable integrated circuits). Furthermore, in other embodiments, the mesh deskew concept of the clocking architecture may allow inputs/outputs (IOs) to provide source synchronous clocks that are phase aligned with the fabric (e.g., the internal FPGA clock network). It should be noted that an input/output (IO) receives an input signal, and forwards the input signal as a clock signal. This clock signal can be used as a reference for the internal FPGA clock network. For example, if it is desired that the IO forwarded clock signal does not change, the FPGA clock network can be phase aligned to this forwarded clock signal.

Also, the clocking architecture may utilize a slower common clock to prevent mode lock during initialization so that local clocks may then run continuously at higher rates. Furthermore, the clocking architecture may utilize memory cells to control the bulk of the delay lines in order to reduce lock time and cost. In addition, the clocking architecture may allow for general clocking connectivity between resources. Also, the clocking architecture may allow for simpler board/pin planning for the user since any IO pin placement will result in the same global skew. In particular, from a user standpoint, the clocking architecture allows for a simplification of clock pin planning because placement of any global clock input/output (IO) pin will result in the same global skew. Such technique obviates the need for users to have to carefully select clock pin to be located somewhere in the center of a device design in order to minimize skew. Another advantage, from the software perspective, is that the disclosed clocking architecture allows for a reduction in runtime from having to fix less hold violations by adding gratuitous routing delays. In some cases, FPGAs may solve hold problems by adding extra routing hops to a given routed signal to slow it down.

It should be noted that one or more embodiments of the clocking architecture described herein may have only one of the above benefits, or a combination (e.g., all) of the above benefits.

Figure 10:
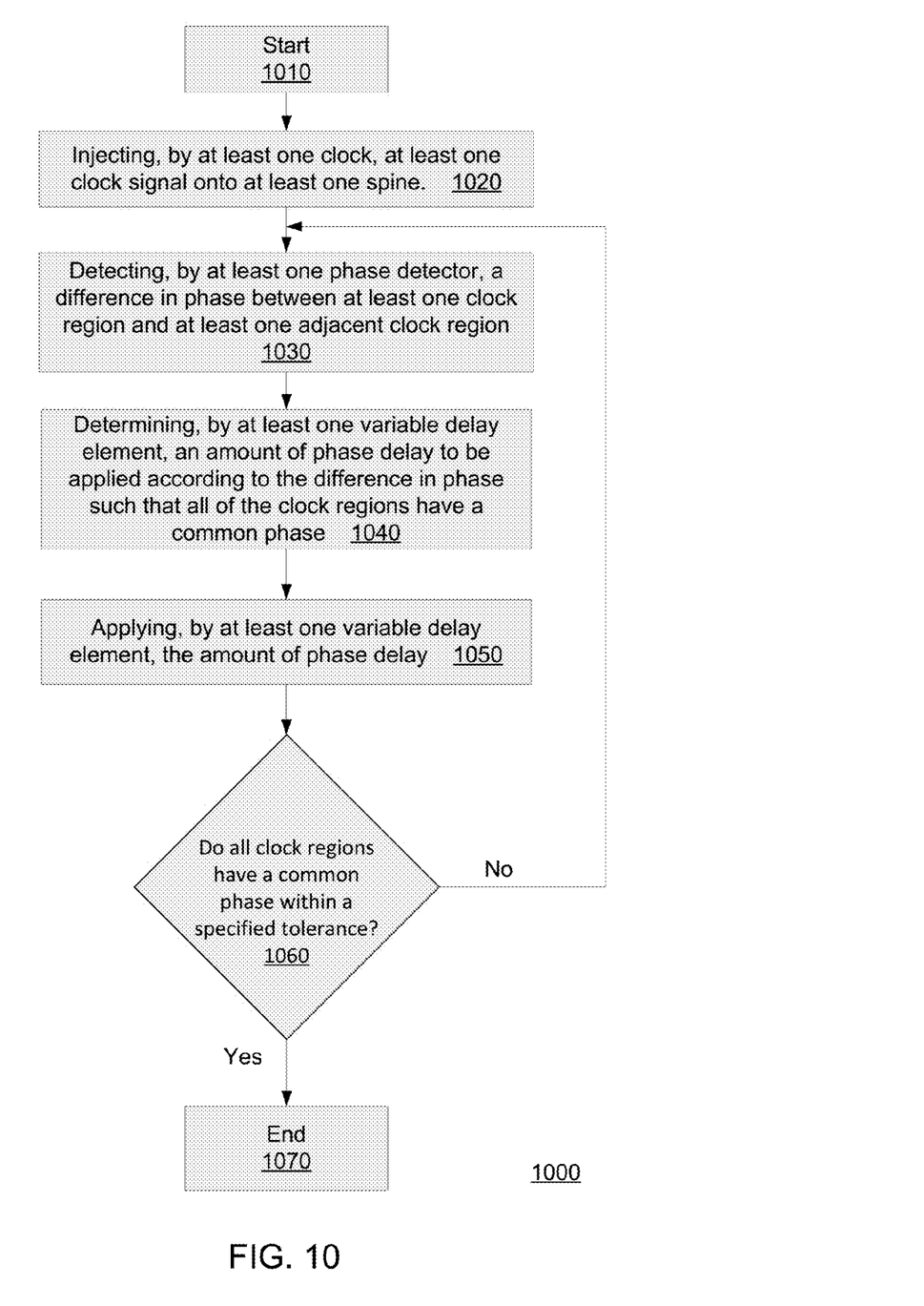
FIG. 10 is flow chart showing a method for operation of the adaptive low skew clocking architecture of FIG. 1.

FIG. 10 is flow chart showing a method 1000 for operation of the disclosed adaptive low skew clocking architecture (e.g., the clocking system of FIG. 1). At the start 1010 of the method 1000, at least one clock injects at least one clock signal onto at least one spine (item 1020). In one or more embodiments, at least one spine runs through at least one clock region. Also, in at least one embodiment, at least one clock region comprises at least one phase detector and at least one delay element. In some embodiments, at least one delay element is connected to at least one spine and at least one phase detector.

Then, at least one phase detector detects a difference in phase between at least one clock region and at least one adjacent clock region (item 1030).

At least one variable delay element then determines an amount of phase delay to be applied according to the difference in phase such that the at least one clock region and the at least one adjacent clock region have a common phase (item 1040). Alternatively, at least one static delay element may be used instead.

Then, at least one variable delay element applies the determined amount of phase delay (item 1050). Alternatively, at least one static delay element may be used instead.

Then, at least one processor, determines whether the clock regions have a common phase within a specified tolerance (item 1060). If it is determined that the clock regions do not have a common phase within the specified tolerance, then the method 1000 returns to item 1030 and continues. However, if it is determined that the clock regions have a common phase within the specified tolerance, then the method 1000 ends at item 1070.

Figure 11:
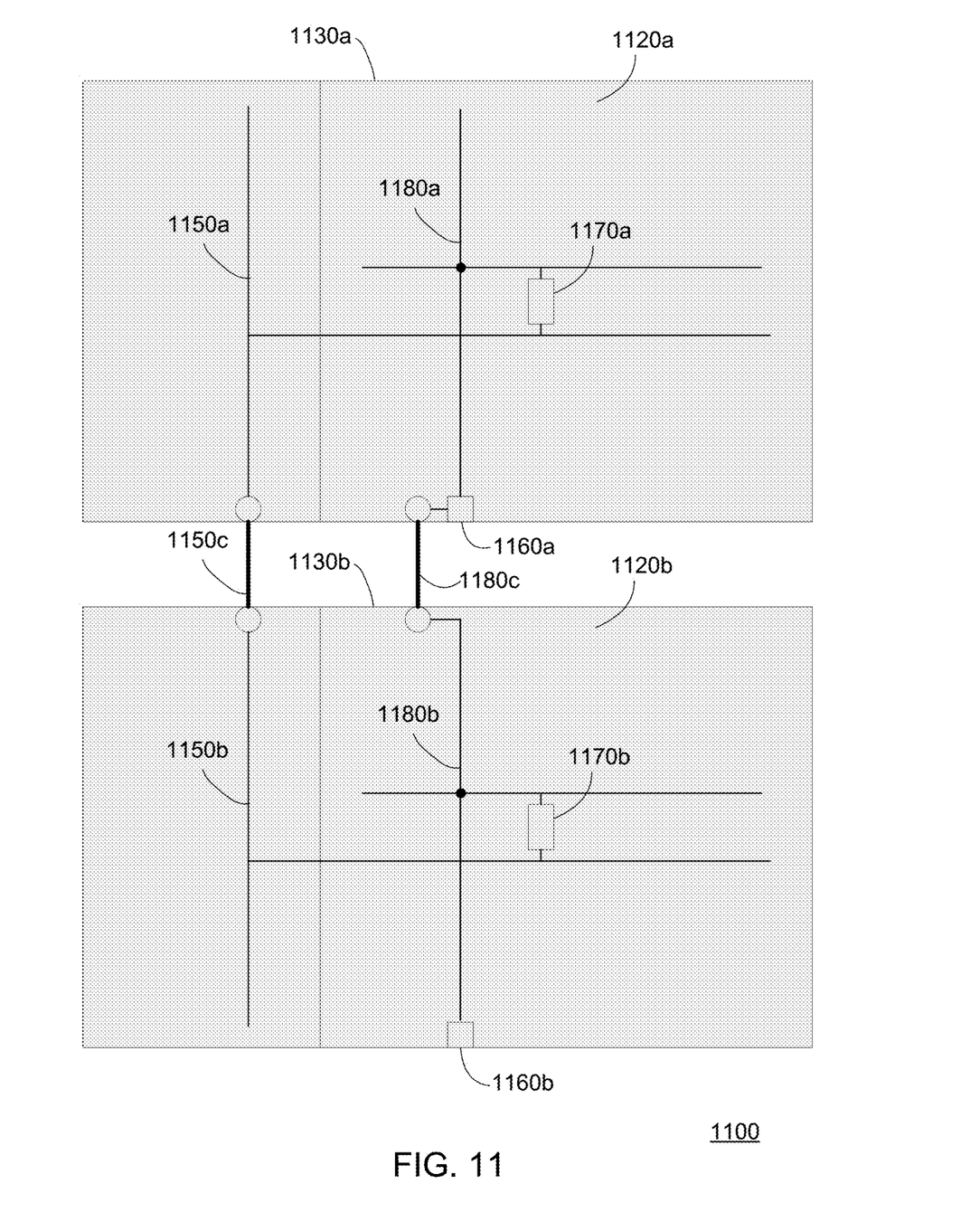
FIG. 11 is a schematic diagram illustrating two clock regions are that are in a multi-die, co-planar configuration.

FIG. 11 is a schematic diagram 1100 illustrating two clock regions 1120*a*, 1120*b* that are in a multi-die, co-planar configuration. This figure shows an exemplary co-planar configuration that may be used to implement the adaptive low skew clocking architecture of FIG. 1. In this figure, two clock regions 1120*a*, 1120*b* are shown to be mounted onto separate dies 1130*a*, 1130*b*. Also, the clock regions 1120*a*, 1120*b* are shown to comprise respective phase detectors 1160*a*, 1160*b*, respective delay elements 1170*a*, 1170*b*, respective spine networks 1150*a*, 1150*b*, and respective phase distribution spine networks 1180*a*, 1180*b*. The spine network 1150*a* of the clock region 1120*a* is connected to the spine network 1150*b* of the clock region 1120*b* via a spine network connector 1150*c*. Also, the phase distribution spine network 1180*a* of the clock region 1120*a* is connected to the phase distribution spine network 1180*b* of the clock region 1120*b* via a phase distribution spine network connector 1180*c*. It should be noted that although both the spine network connector 1150*c* and the phase distribution spine network connector 1180*c* are depicted in FIG. 11, in other embodiments only one connector (e.g., the spine network connector 1150*c* or the phase distribution spine network connector 1180*c*) may be implemented. Since the spine networks 1150*a*, 1150*b* and the phase distribution spine networks 1180*a*, 1180*b* of the two clock regions 1120*a*, 1120*b* are connected to one another, they may be deskewed with each other utilizing the disclosed method (despite the fact that the two clock regions 1120*a*, 1120*b* are mounted on separate dies 1130*a*, 1130*b*).

In other embodiments, the die 1130*a*/1130*b* may contain more than one clock region 1120. For example, in other embodiments, the die 1130*a* and/or the die 1130*b* may each include multiple clock regions that are arranged in a matrix configuration (e.g., rows and/or columns). In addition, in other embodiments, there may be less than or more than two dies 1130*a*, 1130*b*. For example, there may be only one die in which the multiple clock regions are implemented.

Figure 12:
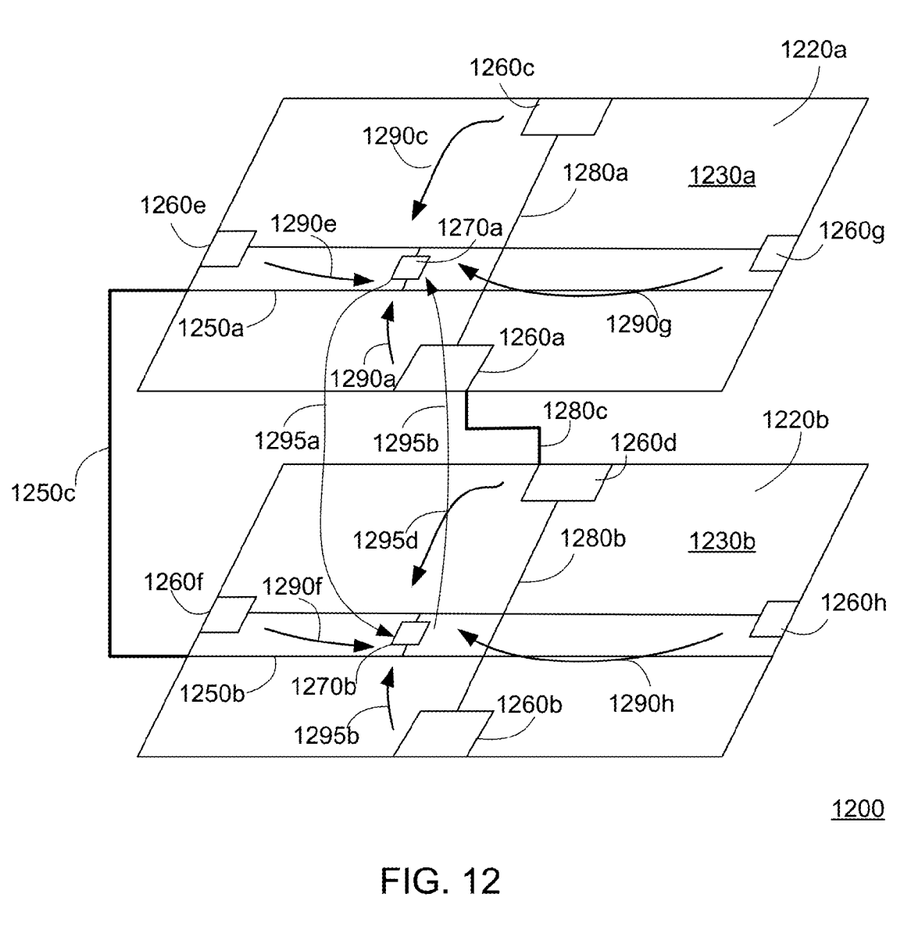
FIG. 12 is a schematic diagram showing two clock regions are that are in a multi-die, stacked configuration.

FIG. 12 is a schematic diagram showing two clock regions 1220*a*, 1220*b* are that are in a multi, die stacked configuration. This figure shows an exemplary stacked configuration that may be used to implement the adaptive low skew clocking architecture of FIG. 1. In this figure, two clock regions 1220*a*, 1220*b* are shown to be mounted onto separate respective dies 1230*a*, 1230*b* that are stacked on top of one another. Also, the clock regions 1220*a*, 1220*b* comprise respective phase detectors 1260*a*-1260*h*; respective delay elements 1270*a*, 1270*b*; respective spine networks 1250*a*, 1250*b*; and respective phase distribution spine networks 1280*a*, 1280*b*. The spine network 1250*a* of the clock region 1220*a* is connected to the spine network 1250*b* of the clock region 1120*b* via a spine network connector 1250*c*. The phase distribution spine network 1280*a* of the clock region 1220*a* is connected to the phase distribution spine network 1280*b* of the clock region 1220*b* via a phase distribution spine network connector 1280*c*. It should be noted that although both the spine network connector 1250*c* and the phase distribution spine network connector 1280*c* are depicted in FIG. 12, in other embodiments only one connector (e.g., the spine network connector 1250*c* or the phase distribution spine network connector 1280*c*) may be implemented. Since the spine networks 1250*a*, 1250*b* and the phase distribution spine networks 1280*a*, 1280*b* of the two clock regions 1220*a*, 1220*b* are connected to one another, they may be deskewed with each other utilizing the disclosed method (despite the fact that the two clock regions 1220*a*, 1220*b* are mounted onto separate stacked dies 1230*a*, 1230*b*). It should be noted that the arrows 1290*a*-1290*h* denote feedback from the respective phase detectors 1260*a*-1260*h* to the delay elements 1270*a*, 1270*b* for the clock regions 1220*a*, 1220*b* according to the phase delays detected by the phase detectors 1260*a*-1260*h*. In addition, arrows 1295*a*, 1295*b* denote that clock region 1220*a* and clock region 1220*b* are being deskewed with one another.

It should be noted that in other embodiments, the die 1230*a*/1230*b* may contain more than one clock region 1220. For example, in other embodiments, the die 1230*a* and/or the die 1230*b* may each include multiple clock regions that are arranged in a matrix configuration (e.g., rows and/or columns). In addition, in other embodiments, there may be more than two stacked dies 1230*a*, 1230*b*.

Also, in other embodiments, some of the dies of the adaptive low skew clocking architecture may be in a stacked configuration (like that shown in FIG. 12) and other dies of the adaptive low skew clocking architecture may be in a co-planar configuration (like that shown in FIG. 11), such that all of the spine networks and the phase distribution spine networks of all of the clock regions are connected to one another to allow for deskewing of all of the clock regions.

It should be noted that the disclosed clocking architecture may be extended to multi-die deskewing, thereby allowing inputs/outputs (IOs) to create source synchronous clocks that can be deskewed by the same network. In addition, it should be noted that the disclosed clocking architecture may use a slower common clock (e.g., a configuration clock) to initially calibrate the system to ensure convergence. Additionally, it should be noted that the disclosed clocking architecture may be applied to ASICs, microprocessors, and/or a system-on-chips (SOCs).

It should be noted that as described above, in some embodiments, the entire delay may be a variable delay that is controlled by the phase detectors 160. In other embodiments, static delay elements may be used instead. For example, in other embodiments, in addition to variable delay elements, there may be static delay elements for the respective clock regions 120 for determining the initial delay values. In one implementation, static timing estimates from software (e.g., known worst case characterized delays) may be used to determine roughly the delay from the source to each clock region 120. Based on this, the appropriate static delay to each clock region 120 may be set via the static delay elements. In other words, in this alternative embodiment, in FIG. 3, the phase detectors 160 are not used to determine what the delay values should be (yet). After the static delay elements are programmed, then the phase detectors 160 become active and change the settings of the delay elements 170. This method has the advantage of requiring cheaper delay elements since only a fraction of the total delay is real-time variable and also reduces the lock time. In this implementation, FIG. 5 is the first time the phase detectors 160 are used.

Where methods described above indicate certain events occurring in certain order, those of ordinary skill in the art having the benefit of this disclosure would recognize that the ordering may be different in different embodiments. Additionally, parts of the methods may be performed concurrently in a parallel process when possible, or sequentially. In addition, more parts or less part of the methods may be performed.

It should be noted that the term "all", as used in this disclosure, may refer to a number that is arbitrarily defined. For example, if a clocking architecture has nine clock regions, "all" of the clock regions may refer to all nine of the clock regions in the entire clocking architecture, or it may refer to any other number, such as "two", of the clock regions in a subset of the total number of clock regions (e.g., if the subset is "two", then "all" of the clock regions in the subset is "two"). Similarly, the term "each", as used in this disclosure, may refer to each item in a number of item(s) that is arbitrarily defined. For example, if a clocking architecture has nine clock regions, "each" of the clock regions, may refer to each of the nine clock regions in the entire clocking architecture, or it may refer to each of any number of clock regions (such as "two" of the clock regions in a subset). For example, if the subset is "two", then "each" of the clock regions in the subset refers to each of the two clock regions.

Although particular examples have been shown and described, it will be understood that it is not intended to limit the claimed invention to the illustrated examples, and it will be obvious to those skilled in the art that various changes and modifications may be made without departing from the claimed invention. The specification and drawings are, accordingly, to be regarded in an illustrative rather than restrictive sense. The claimed invention is intended to cover alternatives, modifications, and equivalents.

What is claimed is:

1. A clocking system, comprising:
   an initial clock region;
   a first adjacent clock region adjacent to the initial clock region;
   a spine to receive a clock signal from a clock, the spine extending through the initial clock region; and
   a first phase detector coupled to detect a difference in phase between the initial clock region and the first adjacent clock region;
   an additional clock region, wherein the initial clock region and the additional clock region are co-planar;
   wherein the initial clock region comprises an initial delay element coupled to the spine and to the first phase detector; and
   wherein the initial clock region and the additional clock region are on respective integrated circuits.

2. The system of claim 1, further comprising:
   a second adjacent clock region adjacent to the initial clock region; and
   a second phase detector coupled to detect a difference in phase between the initial clock region and the second adjacent clock region.

3. The system of claim 2, wherein the second phase detector is coupled to the initial delay element of the initial clock region.

4. The system of claim 2, wherein the first adjacent clock region comprises a first delay element, and the second adjacent clock region comprises a second delay element.

5. The system of claim 2, further comprising:
a third adjacent clock region adjacent to the initial clock region;
a third phase detector to detect a difference in phase between the initial clock region and the third adjacent clock region;
a fourth adjacent clock region adjacent to the initial clock region; and
a fourth phase detector coupled to detect a difference in phase between the initial clock region and the fourth adjacent clock region.

6. The system of claim 5, wherein the third phase detector and the fourth phase detector are coupled to the initial delay element of the initial clock region.

7. The system of claim 1, wherein the initial delay element is configured to determine an amount of phase delay to be applied based at least in part on the difference in phase.

8. The system of claim 1, further comprising the clock, wherein clock comprises a configuration clock or a local clock.

9. The system of claim 1, wherein the delay element comprises a variable delay element.

10. The system of claim 9, wherein the delay element further comprises a static delay element.

11. The system of claim 1, wherein the first phase detector is configured to iteratively detect a difference in phase between the initial clock region and the first adjacent clock region, until a plurality of clock regions that includes the initial clock region and the first adjacent clock region have a common phase within a specified tolerance.

* * * * *